(12) United States Patent
Agata

(10) Patent No.: US 8,197,946 B2
(45) Date of Patent: Jun. 12, 2012

(54) BARRIER LAMINATE, BARRIER FILM SUBSTRATE, METHODS FOR PRODUCING THEM, AND DEVICE

(75) Inventor: Yuya Agata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 913 days.

(21) Appl. No.: 12/029,313

(22) Filed: Feb. 11, 2008

(65) Prior Publication Data

US 2008/0305350 A1    Dec. 11, 2008

(30) Foreign Application Priority Data

Feb. 15, 2007  (JP) ................................. 2007-035052
Dec. 26, 2007  (JP) ................................. 2007-334264

(51) Int. Cl.
*B32B 27/30* (2006.01)
*C08F 2/48* (2006.01)

(52) U.S. Cl. ..................... 428/521; 428/522; 427/508

(58) Field of Classification Search .................. None
See application file for complete search history.

(56) References Cited

U.S. PATENT DOCUMENTS

| | | | |
|---|---|---|---|
| 4,842,893 A | 6/1989 | Yializis et al. | |
| 6,083,628 A | 7/2000 | Yializis | |
| 6,214,422 B1 | 4/2001 | Yializis | |
| 2003/0198830 A1* | 10/2003 | Kim et al. | 428/690 |
| 2004/0058281 A1* | 3/2004 | Yamane et al. | 430/350 |

FOREIGN PATENT DOCUMENTS

| | | |
|---|---|---|
| JP | 2002-205354 A | 7/2002 |
| JP | 2003-53881 A | 2/2003 |
| JP | 2003-89164 A | 3/2003 |
| JP | 2005-289052 A | 10/2005 |
| JP | 2005-313560 A | 11/2005 |

OTHER PUBLICATIONS

Extended European Search Report dated Oct. 7, 2010 in European Application No. 08002713.9.
Japanese Notice of Reasons for Rejection in Japanese Patent Application No. JP 2007-334264, dated Nov. 29, 2011 (with English translation).
Chinese Office Action in Chinese Application No. 200810009965.1, dated Dec. 31, 2011 (with English Translation).

* cited by examiner

*Primary Examiner* — Ramsey Zacharia
(74) *Attorney, Agent, or Firm* — Birch, Stewart, Kolasch & Birch, LLP

(57) ABSTRACT

A barrier laminate comprising at least one organic layer and at least one inorganic layer, in which the organic layer comprises a polymer having a structural unit of the following formula:

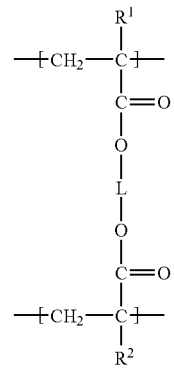

wherein $R^1$ and $R^2$ represent a hydrogen atom or a methyl group; L represents an open-chain alkylene group having at least 8 carbon atoms and not containing an oxygen atom, a nitrogen atom and a sulfur atom.

20 Claims, No Drawings

BARRIER LAMINATE, BARRIER FILM SUBSTRATE, METHODS FOR PRODUCING THEM, AND DEVICE

BACKGROUND OF THE INVENTION

1. Field of the Invention

The present invention relates to a barrier laminate, especially to a barrier laminate having excellent adhesiveness and having a low water vapor permeability, and also relates to a barrier film substrate comprising the barrier laminate and to a device such as an organic EL device (organic electroluminescent device) comprising it.

2. Description of the Related Art

Heretofore, a barrier film fabricated by forming a thin metal oxide film of aluminium oxide, magnesium oxide or silicon oxide on the surface of a plastic film is widely used for wrapping or packaging articles that require shielding from various gases such as water vapor or oxygen and for wrapping or packaging edibles, industrial articles and medicines for preventing them from being deteriorated.

Recently, in the field of liquid-crystal display devices and organic EL devices, plastic film substrates are being used in place of glass substrates that are heavy and readily cracked or broken. As applicable to a roll-to-roll system, plastic film substrates are advantageous in point of cost. However, plastic film substrates are problematic in that their gas-barrier property is not good as compared with that of glass substrates. Therefore, when a plastic film substrate is used in a liquid-crystal display device, then water vapor may penetrate into the liquid-crystal cell, thereby causing display failures.

For solving the problem, it is known to form a water vapor barrier layer on a plastic film, thereby using the resulting barrier film substrate. As such a barrier film substrate, there are known a plastic film coated with silicon oxide through vapor deposition (for example, see JP-B 53-12953, pp. 1-3), and a plastic film coated with aluminium oxide through vapor deposition (for example, see JP-A 58-217344, pp. 1-4). These have a water-vapor barrier level of 1 g/m²·day or so.

However, substrates for use in organic EL devices require a further higher water vapor barrier level. To satisfy the requirement, there have been reported a technique of forming a laminate of an organic layer and an inorganic layer as a barrier layer, thereby realizing a water vapor permeability of less than 0.1 g/m²·day (for example, see JP-A 2003-335880 and JP-A 2003-335820), and a technique of realizing a further lowered water vapor permeability of less than 0.01 g/m²·day (see U.S. Pat. No. 6,413,645).

SUMMARY OF THE INVENTION

However, the organic/inorganic laminate-type barrier film substrates disclosed in these still have some problems in that their barrier capability is not always satisfactory for use in organic EL devices and that the organic layer and the inorganic layer may be readily delaminated owing to mechanical stress applied thereto. Accordingly, it is desired to develop an organic/inorganic laminate-type barrier laminate having good adhesiveness, and a gas-barrier film substrate with the laminate formed on a plastic film, and also a device such as an organic EL device comprising it.

A first object of the invention is to provide an organic/inorganic laminate-type barrier laminate having a water vapor permeability of less than 0.01 g/m²·day and having good adhesiveness, and to provide a barrier film substrate comprising it. A second object of the invention is to provide a device of high durability, comprising the barrier laminate or the barrier film substrate.

The present inventors have assiduously studied and, as a result, have found that, in a barrier laminate comprising an organic layer and an inorganic layer, when an acrylate or methacrylate having a relatively high degree of hydrophobicity is essentially used as the monomer for producing the polymer for use in forming the organic layer, then the mechanical strength (adhesiveness) of the barrier laminate fabricated may be increased, and have completed the present invention described below.

[1] A barrier laminate comprising at least one organic layer and at least one inorganic layer, in which the organic layer comprises a polymer having a structural unit of the following formula (1):

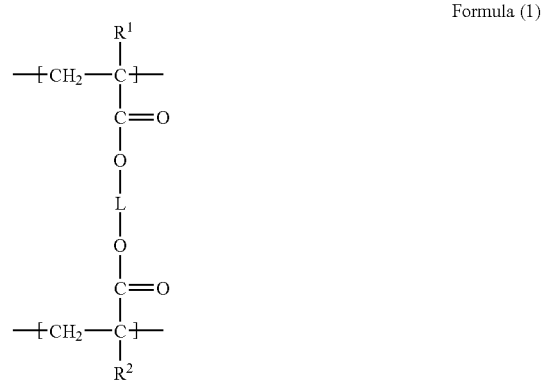

Formula (1)

wherein $R^1$ and $R^2$ each independently represent a hydrogen atom or a methyl group; L represents an open-chain alkylene group having at least 8 carbon atoms and not containing an oxygen atom, a nitrogen atom and a sulfur atom.

[2] The barrier laminate of [1], wherein the polymer has the structural unit of formula (1) in an amount of from 50% by mass to 100% by mass.

[3] The barrier laminate of [1] or [2], wherein the contact angle to water of the organic layer is at least 75 degrees, and the contact angle to diiodomethane of the organic layer is at least 40 degrees.

[4] A barrier film substrate having the barrier laminate of any one of [1] to [3], on at least one surface of a plastic film.

[5] The barrier film substrate of [4], which has the barrier laminate on both surfaces of the plastic film.

[6] The barrier film substrate of [4] or [5], which has, on one surface of the plastic film, at least one layer of the barrier laminate and a matting agent layer provided thereon, and has, on the other surface thereof, at least one layer of the barrier laminate.

[7] A method for producing a barrier laminate having at least one organic layer and at least one inorganic layer, which comprises polymerizing a monomer mixture that contains a bifunctional monomer of the following formula (2), thereby forming the organic layer:

$$Ac^1\text{—O-L-O—}Ac^2 \qquad \text{Formula (2)}$$

wherein $Ac^1$ and $Ac^2$ each independently represent an acryloyl group or a methacryloyl group; L represents an open-chain alkylene group having at least 8 carbon atoms and not containing an oxygen atom, a nitrogen atom and a sulfur atom.

[8] The method for producing a barrier laminate of [7], wherein the content of the bifunctional monomer of formula (2) in the monomer mixture is from 50% by mass to 100% by mass.

[9] The method for producing a barrier laminate of [7] or [8], which comprises laminating the organic layer and the inorganic layer all the time in a vacuum of at most 100 Pa, thereby forming the barrier laminate.

[10] The method for producing a barrier laminate of any one of [7] to [9], which comprises polymerizing the monomer mixture in a vacuum of at most 100 Pa.

[11] The method for producing a barrier laminate of [10], which comprises polymerizing the monomer mixture by UV with energy irradiation of at least 2 J/cm$^2$ in a vacuum of at most 100 Pa.

[12] A method for producing a barrier film substrate, which comprises forming a barrier laminate on at least one surface of a plastic film according to the production method of any one of [7] to [11].

[13] The method for producing a barrier film substrate of [12], which comprises forming, on one surface of the plastic film, at least one layer of the barrier laminate and further forming a matting agent layer on it, and forming, on the other surface thereof, at least one layer of the barrier laminate, in no special order.

[14] A device sealed up with the barrier laminate of any one of [1] to [3].

[15] A device comprising, as the substrate thereof, a barrier film substrate of any one of [4] to [6].

[16] A device sealed up with a barrier film substrate of any one of [4] to [6].

[17] The device of any one of [14] to [16], which is an electronic device.

[18] The device of any one of [14] to [16], which is an organic EL device.

[19] An optical member comprising, as the substrate thereof, the barrier film substrate of any one of [4] to [6].

In the barrier laminate and the barrier film substrate of the invention, the organic layer and the inorganic layer are hardly delaminated owing to the mechanical stress between them; and the laminate and the substrate therefore have a low water vapor permeability. According to the production method of the invention, the barrier laminate and the barrier film substrate can be produced with ease. The device of the invention has high durability.

BEST MODE FOR CARRYING OUT THE INVENTION

The barrier laminate and its production method, the barrier film substrate and its production method, and the device of the invention are described in detail hereinunder. The description made hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof. In the structural formulae in this description, O indicates an oxygen atom.

<Barrier Laminate and Method for Producing it>

The barrier laminate of the invention comprises at least one organic layer and at least one inorganic layer. It is characterized in that the organic layer comprises a polymer having the structural unit of formula (1).

The barrier laminate of the invention may be formed on any substrate regardless of the type thereof. For example, the barrier laminate may be directly formed on a device such as an organic semiconductor device that requires gas-barrier capability, or may be formed separately on a substrate to construct a barrier film substrate.

The inorganic layer and the organic layer, which are the indispensable structural elements of the barrier laminate of the invention, are described in detail hereinunder. The substrate on which the barrier laminate may be formed is described in the section of the barrier film substrate to be given hereinunder.

(Inorganic Layer)

The inorganic layer is, in general, a layer of a thin film formed of a metal compound. For forming the inorganic layer, employable is any method capable of producing the intended thin film. For it, for example, suitable is a coating method, sputtering method, a vacuum evaporation method, an ion-plating method or a plasma CVD method. Concretely, the methods described in Japanese Patent No. 3400324, JP-A 2002-322561, 2002-361774 are employable herein.

Not specifically defined, the component to be in the inorganic layer may be any one that satisfies the above-mentioned performance, for which, for example, employable are oxides, nitrides or oxinitrides containing at least one metal selected from Si, Al, In, Sn, Zn, Ti, Cu, Ce and Ta. Of those preferred are oxides, nitrides or oxinitrides of a metal selected from Si, Al, In, Sn, Zn and Ti; and more preferred are metal oxides, nitrides or oxinitrides with Si or Al. These may contain any other element as a subsidiary component.

Not specifically defined, the thickness of the inorganic layer is preferably within a range of from 5 nm to 500 nm, more preferably from 10 nm to 200 nm. Two or more inorganic layers may be laminated, and in such a case, the constitutive layers may have the same or different compositions.

(Organic Layer)

The organic layer comprises a polymer having a structural unit of the following formula (1):

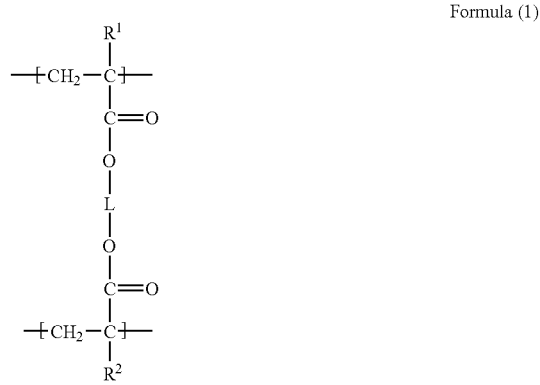

Formula (1)

In formula (1), $R^1$ and $R^2$ each independently represent a hydrogen atom or a methyl group. Preferably, $R^1$ and $R^2$ are the same.

L represents an open-chain alkylene group having at least 8 carbon atoms and not containing an oxygen atom, a nitrogen atom and a sulfur atom. "Open-chain" as referred to herein means a structure not containing a cyclic structure. Preferably, L has from 8 to 12 carbon atoms, more preferably from 8 to 10 carbon atoms, even more preferably 8 or 9 carbon atoms. The alkylene group constituting L may be substituted or not substituted. An example of the substituent for the alkylene group is an alkyl group, for example, including a methyl group, an ethyl group, an n-propyl group, an n-butyl group, an n-pentyl group, an n-hexyl group. The number of the carbon atoms constituting the alkyl group is preferably from 1 to 6, more preferably from 2 to 4.

The organic layer may contain plural types of the structures of formula (1), or may contain only one type of the structure. Preferably, the polymer that constitutes the organic layer contain from 50 to 100% by mass of the structure of formula (1), more preferably from 60 to 100% by mass, even more preferably from 70 to 100% by mass, still more preferably from 70 to 95% by mass thereof. Not specifically defined, the structure except the structure of formula (1) may be any one not too much detracting from the object of the invention. Preferably, the additional structure contains a structural unit derived from acrylate monomers or methacrylate monomers.

The polymer constituting the organic layer is preferably produced through polymerization of a monomer mixture comprising, as the essential ingredient thereof, an acrylate or a methacrylate. The monomer mixture to be used herein includes a bifunctional monomer of the following formula (2):

$$Ac^1—O-L-O—Ac^2 \quad (2)$$

In formula (2), $Ac^1$ and $Ac^2$ each represent an acryloyl group or a methacryloyl group; L represents an open-chain alkylene group having at least 8 carbon atoms and not containing an oxygen atom, a nitrogen atom and a sulfur atom. The details of L and the preferred range thereof are the same as those described hereinabove for L in formula (1).

Examples of the bifunctional monomer of formula (2) are described below, to which, however, the bifunctional monomer of formula (2) for use in the invention should not be limited.

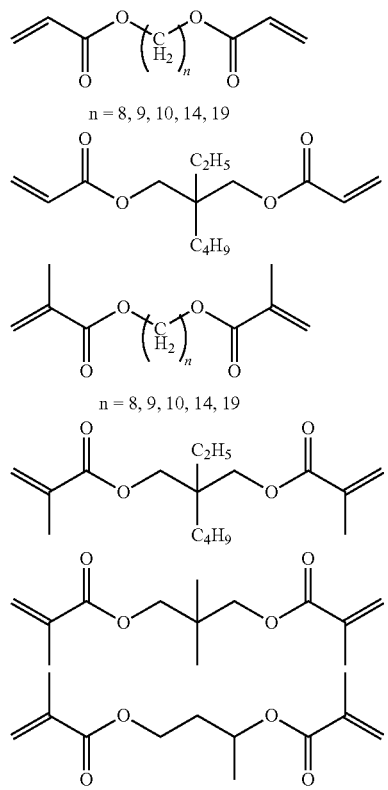

The bifunctional monomer of formula (2) is characterized by low surface energy and good wettability and spreadability in coating. In general, the surface energy may be evaluated by measuring the contact angle to water or diiodomethane of the surface of the organic layer formed by curing the monomer. The bifunctional monomer of formula (2) for use in the invention is preferably such that the contact angle to water of the cured layer is at least 70 degrees, more preferably at least 75 degrees; and even more preferably, the contact angle to water of the layer is at least 75 degrees and the contact angle to diiodomethane of the layer is at least 40 degrees.

The bifunctional monomer of formula (2) may be a single monomer or a mixture of plural types of monomers. The content of the bifunctional monomer of formula (2) to be in the monomer mixture for use in the invention is preferably from 50 to 100% by mass. The monomer mixture for use in the invention may contain any other bifunctional acrylate or methacrylate monomer than the bifunctional monomer of formula (2). In addition, the monomer mixture for use in the invention may contain a monofunctional acrylate or methacrylate monomer, a trifunctional acrylate or methacrylate monomer, a tetrafunctional or more polyfunctional acrylate or methacrylate monomer.

Preferred examples of the acrylate and the methacrylate usable in the invention are, for example, the compounds described in U.S. Pat. Nos. 6,083,628, 6,214,422. Some of them are shown below.

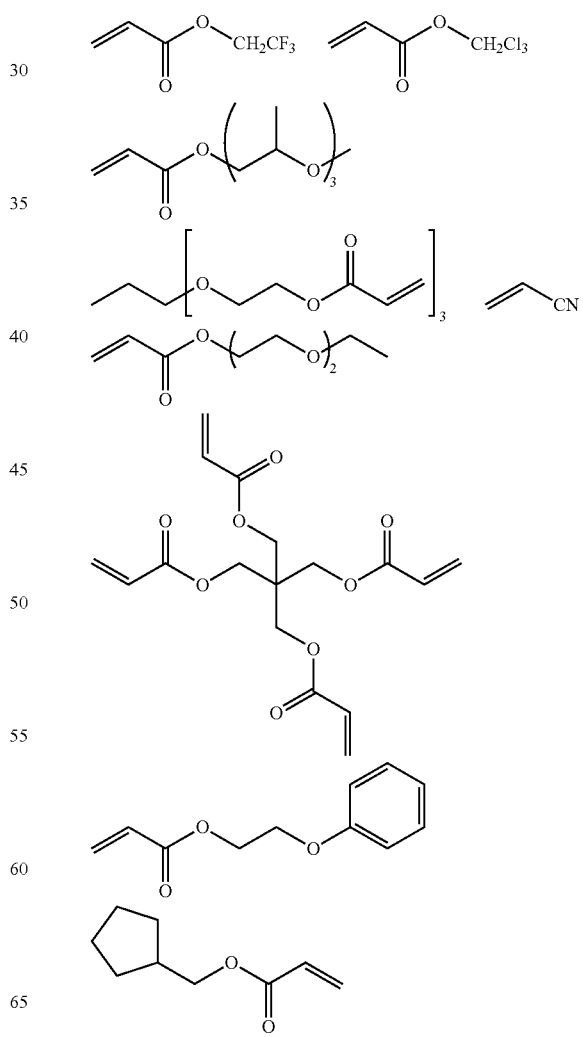

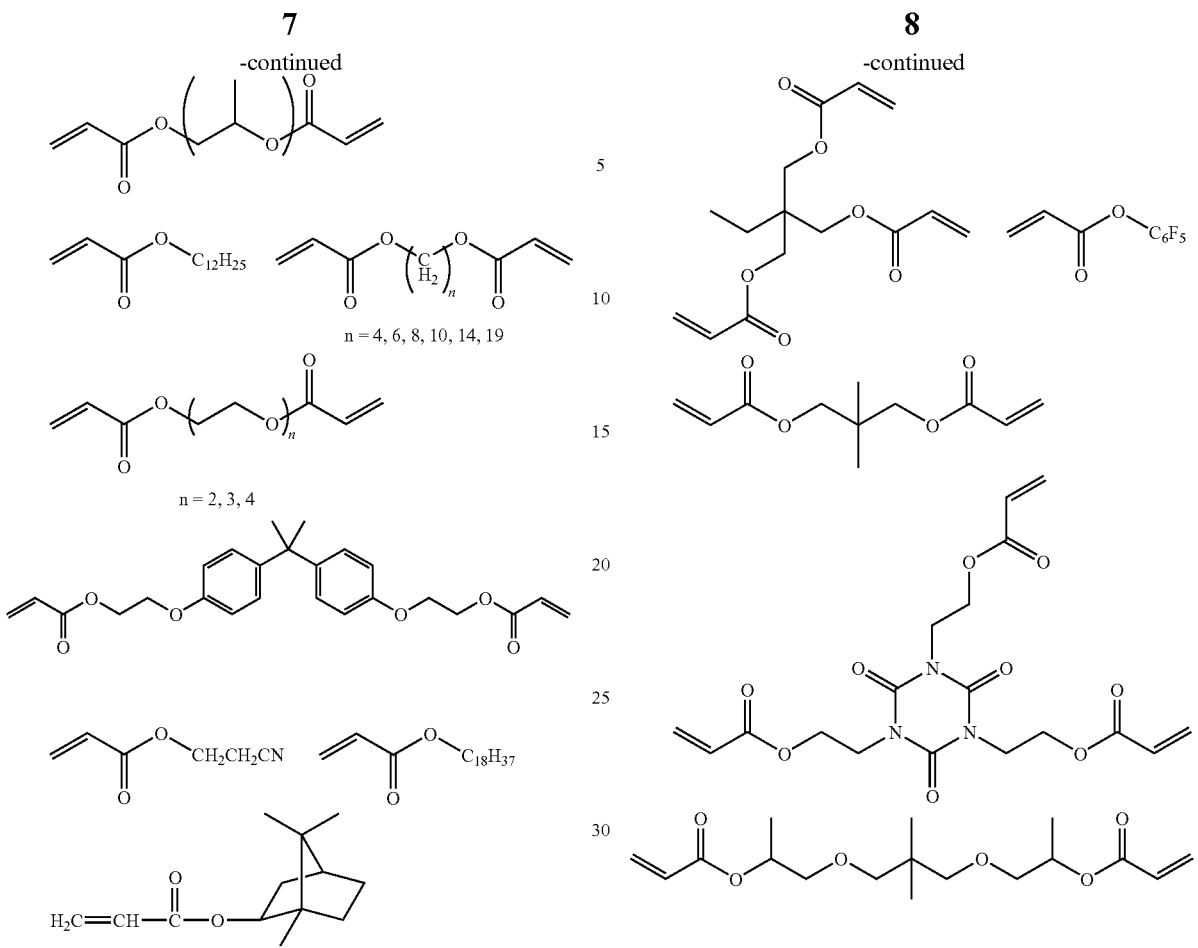
Other examples in addition to the above are the following compounds that are available on the market in Japan.
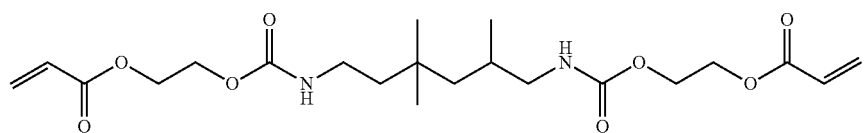
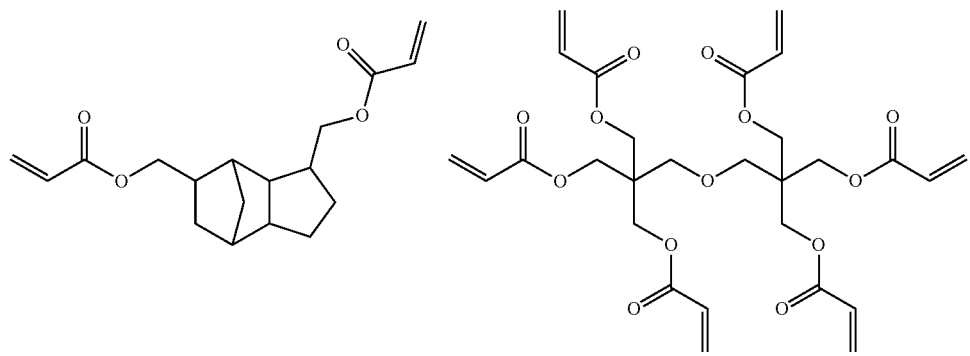

-continued
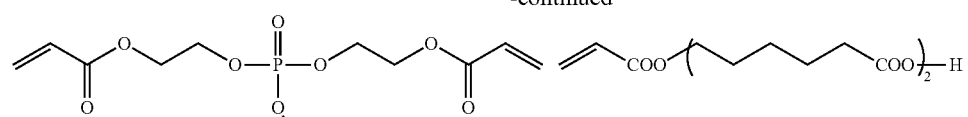
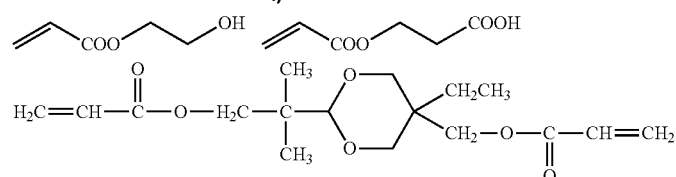
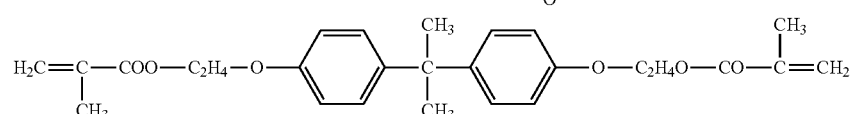
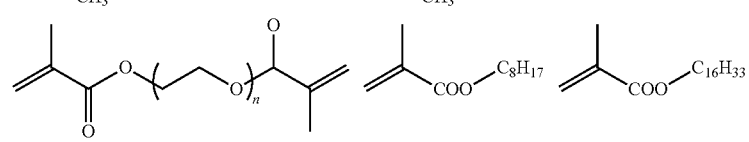
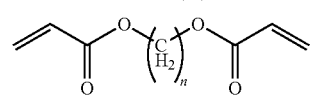
n = 2, 3, 4
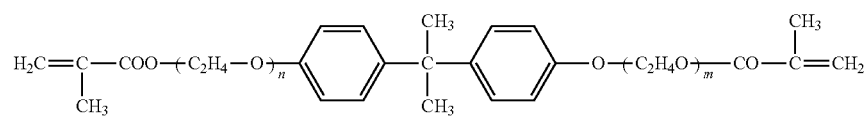
n = 4, 6
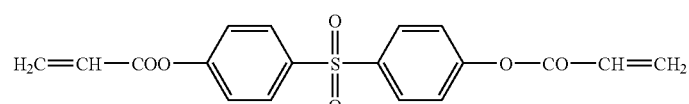
molecular weight = 572,
molecular weight = 660,
molecular weight = 808
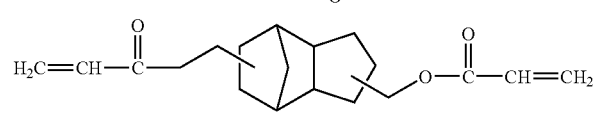
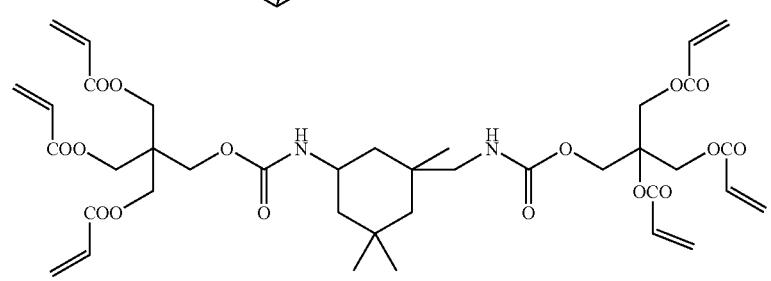
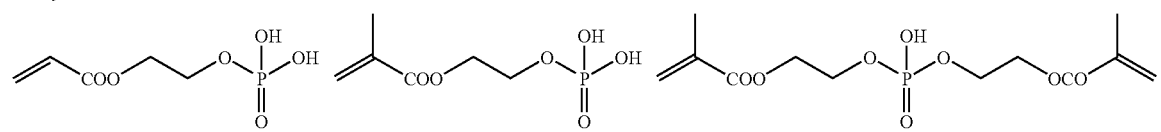

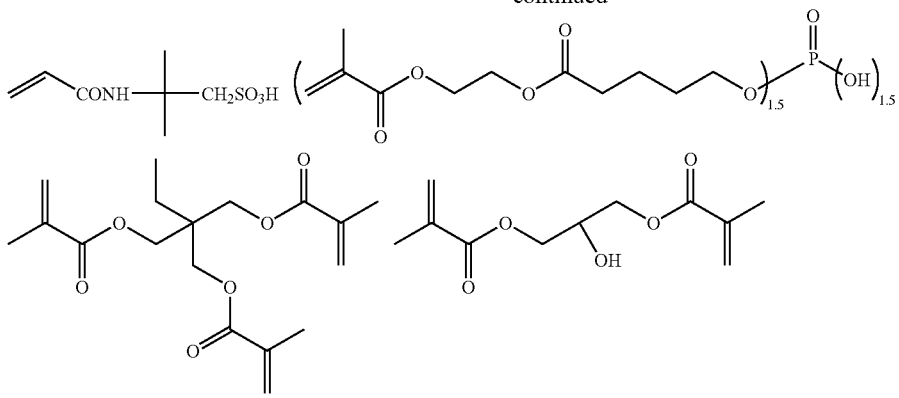

The organic layer may additionally contain a polymer not having the structural unit of formula (1). Examples of the additional polymer are polyester, methacrylic acid/maleic acid copolymer, polystyrene, transparent fluororesin, polyimide, fluoropolyimide, polyamide, polyamidimide, polyether imide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester. The content of the polymer not having the structural unit of formula (1) in the organic layer is preferably from 5 to 50% by mass, more preferably from 10 to 40% by mass, even more preferably from 20 to 35% by mass.

For forming the organic layer, herein employable is an ordinary solution coating method or a vacuum film formation method. The solution coating method includes, for example, a dip coating method, an air knife coating method, a curtain coating method, a roller coating method, a wire bar coating method, a gravure coating method, a slide coating method, and an extrusion coating method of using a hopper as in U.S. Pat. No. 2,681,294. Not specifically defined, the vacuum film formation method is preferably a flash vacuum evaporation method as in U.S. Pat. Nos. 4,842,893, 4,954,371, 5,032,461.

The monomer polymerization method is not specifically defined, for which, for example, preferred is thermal polymerization, light (UV, visible ray) polymerization, electronic beam polymerization, plasma polymerization or their combination. Of those, especially preferred is photopolymerization. In photopolymerization, a photopolymerization initiator may be used. Examples of the photopolymerization initiator are Irgacure series (e.g., Irgacure 651, Irgacure 754, Irgacure 184, Irgacure 2959, Irgacure 907, Irgacure 369, Irgacure 379, Irgacure 819) sold by Ciba Specialty Chemicals; Darocure series (e.g., Darocure TPO, Darocure 1173); Quantacure PDO; Esacure series (e.g., Esacure TZM, Esacure TZT) sold by Sartomer. Preferably, the monomer is polymerized after the monomer mixture has been layerwise disposed. For example, it is desirable that the monomer mixture is disposed on a substrate and then polymerized.

The light for irradiation is generally UV light from high-pressure mercy lamp or low-pressure mercy lamp. The irradiation energy is preferably at least 0.5 J/cm$^2$, more preferably at least 2 J/cm$^2$. Since acrylate and methacrylate receive polymerization inhibition by oxygen in air, it is desirable that the oxygen concentration or the oxygen partial pressure during the monomer polymerization is reduced. In case where the oxygen concentration in polymerization is lowered by a nitrogen substitution method, the oxygen concentration is preferably at most 2%, more preferably at most 0.5%. In case where the oxygen partial pressure in polymerization is lowered by a pressure reduction method, the total pressure is preferably at most 1000 Pa, more preferably at most 100 Pa. Especially preferred is UV polymerization with energy irradiation of at least 2 J/cm$^2$ under a reduced pressure condition of at most 100 Pa.

The thickness of the organic layer is not specifically defined. However, when too thin, the layer could not be uniform; but when too thick, the layer may be cracked and its barrier capability may lower. From these viewpoints, the thickness of the organic layer is preferably from 10 nm to 2000 nm, more preferably from 20 nm to 1000 nm.

Preferably, the hardness of the organic layer is high. It is known that, when the hardness of the organic layer is high, then the inorganic layer may be formed smoothly, and as a result, the barrier capability of the laminate may increase. The hardness of the organic layer may be represented by a microhardness scale based on a nanoindentation method. The microhardness of the organic layer is preferably at least 150 N/mm, more preferably at least 180 N/mm, even more preferably at least 200 N/mm.

(Lamination of Organic Layer and Inorganic Layer)

The lamination of the organic layer and the inorganic layer may be attained by successively and repeatedly forming the organic layer and the inorganic layer in accordance with the intended layer constitution. In case where the inorganic layer is formed according to a vacuum film formation method such as a sputtering method, a vacuum evaporation method, an ion plating method or a plasma CVD method, then it is desirable that the organic layer is formed also according to a vacuum film formation method such as the above-mentioned flash vapor deposition method. While the barrier layer is formed, it is especially desirable that the organic layer and the inorganic layer are laminated all the time in a vacuum of at most 1000 Pa, not restoring the pressure to an atmospheric pressure during the film formation. More preferably, the pressure is at most 100 Pa, even more preferably at most 50 Pa, still more preferably at most 20 Pa.

(Use of Barrier Laminate)

In general, the barrier laminate of the invention is formed on a support. Selecting the support, the barrier laminate may have various applications. The support includes a substrate film, as well as various devices, optical members, etc. Concretely, the barrier laminate of the invention may be used as a barrier layer of a barrier film substrate. The barrier laminate and the barrier film substrate of the invention may be used for sealing up devices that require gas-barrier performance. The barrier laminate and the barrier film substrate of the invention may apply optical members. These are described in detail hereinunder.

<Barrier Film Substrate>

The barrier film substrate comprises a substrate film and a barrier laminate formed on the substrate film. In the barrier film substrate, the barrier laminate of the invention may be provided only one surface of the substrate film, or may be provided on both surfaces thereof. The barrier laminate of the invention may be laminated in an order of an inorganic layer and an organic layer from the side of the substrate film; or may be laminated in an order of an organic layer and an inorganic layer from it. The uppermost layer of the laminate of the invention may be an inorganic layer or an organic layer.

The barrier film substrate of the invention is a film substrate having a barrier layer that functions to block oxygen, water, nitrogen oxide, sulfur oxide, ozone and others in air.

Not specifically defined, the number of the layers that constitutes the barrier film substrate may be typically from 2 layers to 30 layers, more preferably from 3 layers to 20 layers.

The barrier film substrate may have any other constitutive components (e.g., functional layers such as adhesive layer) in addition to the barrier laminate and the substrate film. The functional layer may be disposed on the barrier laminate, or between the barrier laminate and the substrate film, or on the side (back) of the substrate film not coated with the barrier laminate.

(Plastic Film)

In the barrier film substrate of the invention, the substrate film is generally a plastic film. Not specifically defined in point of the material and the thickness thereof, the plastic film usable herein may be any one capable of supporting a laminate of an organic layer and an inorganic layer; and it may be suitably selected depending on the use and the object thereof. Concretely, the plastic film includes metal supports (e.g., aluminium, copper, stainless), and thermoplastic resins such as polyester resin, methacryl resin, methacrylic acid-maleic anhydride, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

In case where the barrier film substrate of the invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of at least 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyethersulfone (PES: 220° C.) polysulfone (PSF: 190° C.), cycloolefin copolymer (COC, compound described in JP-A 2001-150584: 162° C.), fluorene ring-modified polycarbonate (BCF-PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferred.

Since the barrier film substrate of the invention is usable in devices such as organic EL devices, the plastic film is transparent, or that is, its light transmittance is generally at least 80%, preferably at least 85%, more preferably at least 90%. The light transmittance may be measured according to the method described in JIS-K7105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the barrier film substrate of the invention is used in displays, it does not always require transparency in a case where it is not disposed on the viewers' side. Accordingly in such a case, a nontransparent material may be used for the plastic film. The nontransparent material includes, for example, polyimide, polyacrylonitrile, known liquid-crystal polymer.

Not specifically defined, the thickness of the plastic film for use in the barrier film substrate of the invention may be suitably selected depending on its use. Typically, the thickness may be from 1 to 800 μm, preferably from 10 to 200 μm. The plastic film may have a functional layer such as a transparent conductive layer, a primer layer, etc. The functional layer is described in detail in JP-A 2006-289627, paragraphs 0036 to 0038. Examples of other functional layers than those are a matting agent layer, a protective layer, an antistatic layer, a planarizing layer, an adhesiveness improving layer, a light shielding layer, an antireflection layer, a hard coat layer, a stress relaxing layer, an antifogging layer, an anti-soiling layer, a printable layer, an adhesive layer, etc.

<Device>

The barrier laminate and the barrier film substrate of the invention are favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, other electronic devices. More preferred are organic EL devices.

The barrier laminate of the invention may be used for film-sealing of devices. Specifically, this is a method of providing a barrier laminate of the invention on the surface of a device serving as a support by itself. Before providing the barrier laminate, the device may be covered with a protective layer.

The barrier film substrate of the invention may be used as a substrate of a device or as a film for sealing up according to a solid sealing method. The solid sealing method comprises forming a protective layer on a device, then forming an adhesive layer and a barrier film substrate as laminated thereon, and curing it. Not specifically defined, the adhesive may be a thermosetting epoxy resin, a photocurable acrylate resin, etc.

(Organic EL Device)

Examples of an organic EL device with a barrier film substrate are described in detail in JP-A 2007-30387.

(Liquid-Crystal Display Device)

A reflection-type liquid-crystal display device has a constitution of an under substrate, a reflection electrode, a lower alignment film, a liquid-crystal layer, an upper alignment layer, a transparent electrode, an upper substrate, a λ/4 plate and a polarizing film, formed in that order from the bottom. In this, the barrier film substrate of the invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode, a lower alignment film, a liquid-crystal layer, an upper alignment film, an upper transparent electrode, an upper substrate, a λ/4 plate and a polarizing film, formed in that order from the bottom. In this, the substrate of the invention may be sued as the upper transparent electrode and the upper substrate. In color displays, it is desirable that a color filter layer is additionally provided between the lower transparent electrode and the lower alignment film, or between the upper alignment film and the transparent electrode. Not specifically defined, the type of the liquid-crystal cell is a TN (twisted nematic) type, an STN (super-twisted nematic) type, a HAN (hybrid aligned nematic) type, a VA (Vertically Alignment) type, an ECB (Electrically Controlled Birefringence) type, an OCB (optically compensatory bent) type, or a CPA (continuous pinwheel alignment) type.

(Others)

Other applications of the invention are thin-film transistors as in JP-T 10-512104, touch panels as in JP-A 5-127822, 2002-48913, electronic papers as in JP-A 2000-98326, and solar cells as in Japanese Patent Application No. 7-160334.

<Optical Member>

An example of the optical member that comprises the barrier laminate of the invention is a circular polarizer.

(Circular Polarizer)

Laminating a barrier film substrate of the invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the invention are described more concretely with reference to the following Examples. In the following Examples, the material used, its amount and the ratio, the details of the treatment and the treatment process may be suitably modified or changed not overstepping the sprit and the scope of the invention. Accordingly, the invention should not be limitatively interpreted by the Examples mentioned below.

1. Fabrication of Barrier Film Substrate through Polymerization Under Normal Pressure A polyethylene naphthalate film (Teijin DuPont's trade name, Neotex Q65FA) was cut into 20 cm×20 cm pieces, and a barrier laminate was formed on the side of the smooth surface thereof, and the thus-constructed samples were evaluated.

(1-1) Formation of First Inorganic Layer:

Using a sputtering device, a first inorganic layer (aluminium oxide) was formed on the smooth surface of the polyethylene naphthalate film. Aluminium was used as the target; argon was used as the discharge gas; and oxygen was used as the reaction gas. The film formation pressure was 0.1 Pa; and the ultimate film thickness was 50 nm.

(1-2) Formation of First Organic Layer:

On the first inorganic layer formed on the plastic film, a mixture solution of a monomer shown in Table 1 (20 g), a UV polymerization initiator (Ciba Speciality Chemicals' trade name, Ciba Irgacure 907) (0.6 g) and 2-butanone (190 g) was applied, using a wire bar, so as to form a liquid layer having a thickness of 5 μm. This was dried at room temperature for 2 hours, then put into a chamber having an oxygen Concentration of 0.45% after nitrogen substitution, and the organic layer was cured therein through irradiation with UV light from a high-pressure mercury lamp (integrated radiation, about 2 J/cm$^2$), thereby constructing barrier film substrates of the invention (samples 1 and 2) and comparative barrier film substrates (samples 3 to 8). In these, the film thickness was 500 nm±50 nm.

(1-3) Measurement of Contact Angle:

The contact angle to water and diiodomethane ($CH_2I_2$) of the surface of the first organic layer of samples 1 to 8 was measured, using a contact angle gauge (CA-X Model by Kyowa Kaimen Kagaku). The data are shown in Table 1.

(1-4) Measurement of Adhesiveness:

According to a cross-cut peeling method based on JIS (Japan Industrial Standard) K5600-5-6 (ISO 2409), the barrier laminates were analyzed for the adhesiveness. For their evaluation, the samples were expressed by the ratio (percentage) of the area of the film not broken; and the data are shown in Table 1. Larger data mean higher adhesiveness.

(1-5) Evaluation:

The barrier film substrates of the invention, samples 1 and 2 had a large contact angle to water after organic layer film formation, of 79.5 degrees and 75.5 degrees; and they are hydrophobic and had low surface energy. The comparative barrier film substrates, samples 3 to 8 had a contact angle to water after organic layer formation, of less than 75 degrees; and as compared with that of the organic layer in the invention, the hydrophilicity of the organic layer in the comparative samples was higher and the surface energy thereof was larger.

The barrier film substrates of the invention, samples 1 and 2 had higher adhesiveness, as compared with the comparative barrier film substrates, samples 3 to 8.

In comparison between sample 1 and sample 2, both the barrier film substrates of the invention, the contact angle to diiodomethane of the sample 1 was 29.9 degrees, while that of the sample 2 was 42.0 degrees and was large. This means that the surface energy dispersion force component of the organic layer of the sample 2 is smaller. As a result, the adhesiveness of the sample 2 is higher having a significant difference, and the sample 2 is much superior to the others.

TABLE 1

| Sample No. | Monomer | Contact Angle (degrees) | | Adhesiveness (%) | Remarks |
|---|---|---|---|---|---|
| | | Water | $CH_2I_2$ | | |
| Sample 1 | 1,9-nonanediol diacrylate | 79.5 | 29.9 | 80 | the invention |
| Sample 2 | 2-butyl-2-ethyl-1,3-propanediol diacrylate | 75.5 | 42.0 | 90 | the invention |

TABLE 1-continued

| Sample No. | Monomer | Contact Angle (degrees) Water | Contact Angle (degrees) CH$_2$I$_2$ | Adhesiveness (%) | Remarks |
|---|---|---|---|---|---|
| Sample 3 | 1,6-hexanediol diacrylate | 74.6 | 29.3 | 50 | comparative sample |
| Sample 4 | neopentylglycol diacrylate | 73.5 | 39.3 | 30 | comparative sample |
| Sample 5 | bisphenol A ethylene oxide adduct diacrylate (number of EO added = 4) | 74.0 | 32.4 | 40 | comparative sample |
| Sample 6 | bisphenol A ethylene oxide adduct diacrylate (number of EO added = 10) | 66.4 | 24.8 | 0 | comparative sample |
| Sample 7 | bisphenol A propylene-oxide adduct diacrylate (number of EO added = 4) | 74.6 | 36.2 | 0 | comparative sample |
| Sample 8 | tripropylene glycol diacrylate | 69.9 | 36.9 | 10 | comparative sample |

2. Fabrication of Barrier Film Substrate through Vacuum Polymerization

A polyethylene naphthalate film (Teijin DuPont's trade name, Neotex Q65FA) was cut into 20 cm×20 cm pieces, and a barrier laminate was formed on the side of the smooth surface thereof, and the thus-constructed samples were evaluated.

(2-1) Formation of First Inorganic Layer:

Using a sputtering device, a first inorganic layer (aluminium oxide) was formed on the smooth surface of the polyethylene naphthalate film. Aluminium was used as the target; argon was used as the discharge gas; and oxygen was used as the reaction gas. The film formation pressure was 0.1 Pa; and the ultimate film thickness was 50 nm.

(2-2) Formation of First Organic Layer:

On the first inorganic layer formed on the plastic film, a mixture solution of a monomer shown in Table 2 (20 g), a UV polymerization initiator (Ciba Speciality Chemicals' trade name, Ciba Irgacure 907) (0.6 g) and 2-butanone (190 g) was applied, using a wire bar, so as to form a liquid layer having a thickness of 5 μm. This was dried at room temperature for 2 hours, then put into a vacuum chamber having an inner pressure of 30 Pa, and the organic layer was cured therein through irradiation with UV light from a high-pressure mercury lamp (integrated radiation, about 2 J/cm$^2$), thereby constructing barrier film substrates of the invention (samples 11 to 13) and comparative barrier film substrates (samples 14 and 15). In these, the film thickness was 500 nm±50 nm.

(2-3) Measurement of Adhesiveness:

The adhesiveness was measured according to the same method as in the above (1-4). The data are shown in Table 2.

(2-4) Evaluation:

The barrier film substrates of the invention, samples 11 to 13 had higher adhesiveness, as compared with the comparative barrier film substrates, samples 14 and 15.

As compared with that of the above samples 1 and 2, the adhesiveness of the barrier film substrates of the invention, samples 11 to 13 was higher. This confirms that the vacuum polymerization at an inner pressure of at most 100 Pa gives better barrier film substrates having much higher adhesiveness, as compared with the polymerization in an atmosphere in which the oxygen concentration is reduced to at most 0.5% by nitrogen substitution.

TABLE 2

| Sample No. | Monomer | Adhesiveness (%) | Remarks |
|---|---|---|---|
| Sample 11 | 1,9-nonanediol diacrylate | 95 | the invention |
| Sample 12 | 2-butyl-2-ethyl-1,3-propanediol diacrylate | 100 | the invention |
| Sample 13 | 1,9-nonanediol dimethacrylate | 100 | the invention |
| Sample 14 | tripropylene glycol diacrylate | 15 | comparative sample |
| Sample 15 | neopentyl glycol-modified trimethylolpropane diacrylate* | 20 | comparative sample |

*Nippon Kayaku's KAYARAD R-604

3. Construction of Barrier Film Substrate by Lamination of Inorganic Layer and Organic Layer in Order on Plastic Film (3-1) Construction of Barrier Film Substrate in Organic/Inorganic Vacuum Integrated Lamination System:

A polyethylene naphthalate film (Teijin DuPont's trade name, Neotex Q65FA) was cut into 20 cm×20 cm pieces. Using an organic/inorganic laminate film formation device (Vitex Systems' Guardian 200), a barrier laminate shown in Table 3 was formed on the side of the smooth surface of the film. Guardian 200 is a device for producing an organic/inorganic lamination-type barrier laminate. In this, an organic layer and an inorganic layer are continuously formed all in vacuum, and therefore, the barrier laminate to be produced therein is not exposed to open air until the completion of its production. The inorganic layer formation method in the device is flash vapor evaporation at an inner pressure of 3 Pa, and the UV radiation energy for polymerization was 2 J/cm$^2$. As the material for the organic layer, used was a mixture solution of 1,9-nonanediol acrylate (Kyoeisha Chemical's trade name, Light-Acrylate, 80 g), Kyceisha's Light-Acrylate TMP-A (10 g), Kyoeisha's Light-Acrylate BO-A (5 g), and a UV polymerization initiator (EZACURE-TZT, 5 g). For inorganic film formation, employed was aluminium oxide film formation according to a DC-pulse reactive sputtering method with aluminium as a target (in which the reaction gas is oxygen). The thickness of the formed organic layer was 500 nm/layer; the thickness of the formed inorganic layer (aluminium oxide) was 50 nm/layer. According to the production method of the invention as above, barrier film substrates, samples 21 to 23 were constructed.

In the same manner as the above for the samples 21 to 23 but forming an organic layer and an inorganic layer in order on both surfaces of the substrate (polyethylene naphthalate film), a barrier film substrate, sample 24 was constructed, having a layer constitution of "inorganic layer/organic layer/substrate/organic layer/inorganic layer".

In the same manner as the above for the samples 21 to 23 but using, as the material for the organic layer, a mixture used for the organic layer constituting the barrier film described in JP-A 2003-335880, of dicyclopentadienyl diacrylate (Aronix M-203, by Toa Gosei, 95 g) and a UV polymerization initiator (EZACURE-TZT, 5 g), a comparative barrier film substrate, sample 25 was constructed, having a layer constitution of "inorganic layer/organic layer/inorganic layer/substrate".

In the same manner as the above for the samples 21 to 23 but using, as the material for the organic layer, a mixture used for the organic layer constituting the barrier film described in JP-A 2003-335880, of neopentylglycol-modified trimethylolpropane diacrylate (Nippon Kayaku's KAYARAD R-604, 95 g) and a UV polymerization initiator (EZACURE-TZT, 5 g), a comparative barrier film substrate, sample 26 was constructed, having a layer constitution of "inorganic layer/organic layer/inorganic layer/substrate".

In the same manner as that for the sample 25 but forming an organic layer and an inorganic layer in order on both surfaces of the above substrate (polyethylene terephthalate film), a barrier film substrate, sample 27 was constructed, having a layer constitution of "inorganic layer/organic layer/substrate/organic layer/inorganic layer".

(3-2) Determination of Water Vapor Permeability:

Using a water vapor permeability tester (MOCON's PERMATRAN-W3/31), each sample was analyzed for the water vapor permeability at 40° C. and a relative humidity of 90%. The detection limit of the tester is 0.01 g/m²·day. The data are shown in Table 3. The water vapor permeability of all the barrier film substrates of the invention, samples 21 to 24 was lower than the detection limit of the tester, 0.01 g/m² day; however, the water vapor permeability of the comparative barrier film substrates, samples 25 to 27, for which was used a cyclic structure-having acrylate, was 0.08 g/m²·day, 0.06 g/m²·day and 0.02 g/m² day, respectively.

The above confirms that the barrier film substrates for which was used an open-chain acrylate satisfying the condition of the present invention are excellent in point of both the barrier capability and the adhesiveness.

TABLE 3

| Sample No. | Organic Layer | Layer Constitution | Water Vapor Permeability (g/m²/day) | Remarks |
|---|---|---|---|---|
| Sample 21 | 1,9-nonanediol diacrylate | inorganic layer/ organic layer/ inorganic layer/ substrate | lower than the detection limit | the invention |
| Sample 22 | 1,9-nonanediol diacrylate | organic layer/ inorganic layer/ organic layer/ inorganic layer/ substrate | lower than the detection limit | the invention |
| Sample 23 | 1,9-nonanediol diacrylate | inorganic layer/ organic layer/ inorganic layer/ organic layer/ substrate | lower than the detection limit | the invention |
| Sample 24 | 1,9-nonanediol diacrylate | inorganic layer/ organic layer/ substrate/ organic layer/ inorganic layer | lower than the detection limit | the invention |
| Sample 25 | dicyclopentadienyl diacrylate | inorganic layer/ organic layer/ inorganic layer/ substrate | 0.08 | comparative sample |
| Sample 26 | neopentyl glycol-modified trimethylolpropane diacrylate | inorganic layer/ organic layer/ inorganic layer/ substrate | 0.06 | comparative sample |
| Sample 27 | dicyclopentadienyl diacrylate | inorganic layer/ organic layer/ substrate/ organic layer/ inorganic layer | 0.04 | comparative sample |

4. Construction and Evaluation of Organic EL Device (1) Construction of Organic EL Device:

An ITO film-coated conductive glass substrate (surface resistivity, 10 Ω/square) was washed with 2-propanol, and then subjected to UV-ozone treatment for 10 minutes. On this substrate (anode), the following organic compound layers were deposited in order according to a vapor deposition method.

| (First Hole Transportation Layer) | |
|---|---|
| Copper Phthalocyanine | thickness 10 nm |
| (Second Hole Transportation Layer) | |
| N,N'-diphenyl-N,N'-dinaphthylbenzidine | thickness 40 nm |
| (Light Emission Layer serving also as electron transportation layer) | |
| Tris(8-hydroxyguinolinato) aluminium | thickness 60 nm |

Finally, lithium fluoride was vapor-deposited in a thickness of 1 nm and metal aluminium was in a thickness of 100 nm in that order, serving as a cathode. On this, a silicon nitride film having a thickness of 5 µm was formed according to a parallel plate CVD method, thereby constructing an organic EL device (OEL-1, 2).

(2) Sealing of Organic EL Device (1):

Using a thermosetting adhesive (Daizo-Nichimori's Epotec 310), the device was stuck to the barrier film substrate, sample 20 to 23 (sealing film), and heated at 65° C. for 3 hours to cure the adhesive. Thus sealed, organic EL devices (BOEL-1 to 3) were obtained.

TABLE 4

| Organic EL Device | Sealing film |
|---|---|
| BOEL-1 | Sample 21 |
| BOEL-2 | Sample 22 |
| BOEL-3 | Sample 23 |

(3) Evaluation of Organic EL Device for the Surface Condition with Light Emission:

Immediately after their construction, the organic EL devices (BOEL-1 to 3) were driven for light emission with a voltage of 7V applied thereto from a current/voltage generator (Keithley's SMU2400 Model source measure unit). Using a microscope, the surface of each sample was checked for its condition with light emission, and it was confirmed that all the devices gave uniform light emission with no dark spot.

Next, the devices were kept in a dark room at 40° C. and a relative humidity of 90% for 60 days, and checked for the surface condition with light emission. The ratio of the emission area after storage to the emission area before storage was 92% in BOEL-1, 93% in BOEL-2, and 96% in BOEL-3, and all the devices gave no dark spot.

(4) Sealing of Organic EL Device (2):

The organic EL device constructed in "(1) Construction of Organic EL Device" was sealed up with the organic/inorganic laminate barrier film (the barrier laminate of the invention), using the organic/inorganic laminate film formation device according to the method described in "(3-1) Construction of Barrier Film Substrate in organic/inorganic vacuum integrated lamination system". The thus-sealed organic EL devices were evaluated for the surface condition with light emission, according to the evaluation method described in "(3) Evaluation of Organic EL device for the surface condition with light emission", and they gave no dark spot like the above sealed with a barrier film substrate.

The above confirms that the organic EL devices sealed with the barrier laminate of the invention have excellent wet heat durability.

In the barrier laminate and the barrier film substrate of the invention, the organic layer and the inorganic layer are hardly delaminated, and the laminate and the substrate have a low water vapor permeability. According to the production method of the invention, the barrier laminate and the barrier film substrate may be readily produced. The barrier laminate and the barrier film substrate of the invention can be used as sealing films, and in particular, the barrier film laminate of the invention is useful as a substitute for conventional glass substrates. Accordingly, the invention is widely applicable to various industrial products, typically for example, to various devices such as organic EL devices.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 035052/2007 filed on Feb. 15, 2007 and Japanese Patent Application No. 334264/2007 filed on Dec. 26, 2007, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A barrier laminate comprising at least one organic layer and at least one inorganic layer, in which the organic layer comprises a polymer having a structural unit of the following formula (1):

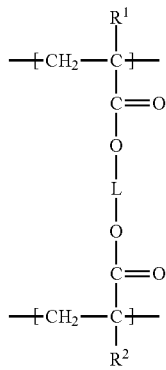

Formula - (1)

wherein $R^1$ and $R^2$ each independently represent a hydrogen atom or a methyl group; L represents a 1,9-nonylene group or a 2-butyl-2-ethyl-1,3-propylene group.

2. The barrier laminate according to claim 1, wherein the polymer has the structural unit of formula (1) in an amount of from 50% by mass to 100% by mass.

3. The barrier laminate according to claim 1, wherein the contact angle to water of the organic layer is at least 75 degrees, and the contact angle to diiodomethane of the organic layer is at least 40 degrees.

4. A barrier film substrate having the barrier laminate of claim 1, on at least one surface of a plastic film.

5. The barrier film substrate according to claim 4, which has the barrier laminate on both surfaces of the plastic film.

6. The barrier film substrate according to claim 4, which has, on one surface of the plastic film, at least one layer of the barrier laminate and a matting agent layer provided thereon, and has, on the other surface thereof, at least one layer of the barrier laminate.

7. An optical member comprising the barrier film substrate of claim 4.

8. A device comprising the barrier laminate of claim 1.

9. The device according to claim 8, which is sealed up with the barrier laminate.

10. The device according to claim 8, which comprises a barrier film substrate having the barrier laminate.

11. The device according to claim 8, which is sealed up with a barrier film substrate having the barrier laminate.

12. The device according to claim 8, which is an electronic device.

13. The device according to claim 8, which is an organic EL device.

14. A method for producing a barrier laminate having at least one organic layer and at least one inorganic layer, which comprises polymerizing a monomer mixture that contains a bifunctional monomer of the following formula (2), thereby forming the organic layer:

$$Ac^1\text{—O-L-O—}Ac^2 \qquad \text{Formula (2)}$$

wherein $Ac^1$ and $Ac^2$ each independently represent an acryloyl group or a methacryloyl group; L represents a 1,9-nonylene group or a 2-butyl-2-ethyl-1,3-propylene group.

15. The method for producing a barrier laminate according to claim 14, wherein the content of the bifunctional monomer of formula (2) in the monomer mixture is from 50% by mass to 100% by mass.

16. The method for producing a barrier laminate according to claim 14, which comprises laminating the organic layer and the inorganic layer all the time in a vacuum of at most 100 Pa, thereby forming the barrier laminate.

17. The method for producing a barrier laminate according to claim 14, which comprises polymerizing the monomer mixture in a vacuum of at most 100 Pa.

18. The method for producing a barrier laminate according to claim 17, which comprises UV-polymerizing the layer-wise-disposed monomer mixture with energy irradiation of at least 2 J/cm$^2$ in a vacuum of at most 100 Pa.

19. A method for producing a barrier film substrate, which comprises forming a barrier laminate on at least one surface of a plastic film according to the production method of claim 14.

20. The method for producing a barrier film substrate according to claim 19, which comprises forming, on one surface of the plastic film, at least one layer of the barrier laminate and further forming a matting agent layer on it, and forming, on the other surface thereof, at least one layer of the barrier laminate, in no special order.

* * * * *